United States Patent [19]

Copeland et al.

[11] Patent Number: 5,613,197
[45] Date of Patent: Mar. 18, 1997

[54] MULTI-CHANNEL TRANSPONDER WITH CHANNEL AMPLIFICATION AT A COMMON LOWER FREQUENCY

[75] Inventors: Wilbert B. Copeland, Los Angeles; Erik Soderburg, Redondo Beach; John Dunwoody, Long Beach; Robert Brunner, Redondo Beach; Keith Williams, Los Angeles, all of Calif.

[73] Assignee: Hughes Aircraft Co., Los Angeles, Calif.

[21] Appl. No.: 334,491

[22] Filed: Nov. 3, 1994

[51] Int. Cl.$^6$ ............................................ H04B 7/14
[52] U.S. Cl. ..................... 455/22; 455/11.1; 455/12.1; 455/20; 455/209
[58] Field of Search ........................... 455/22, 209, 315, 455/316, 317, 311, 207, 11.1, 12.1, 15, 20, 103, 102, 118

[56] References Cited

U.S. PATENT DOCUMENTS

| | | | |
|---|---|---|---|
| 3,079,557 | 11/1960 | Crabtree | 455/22 |
| 3,710,255 | 1/1973 | Gicca | 455/22 |
| 4,431,977 | 2/1984 | Sokola et al. | 333/206 |
| 4,653,117 | 3/1987 | Heck | 455/256 |
| 4,918,748 | 4/1994 | Shahriary et al. | 455/315 |
| 4,972,346 | 11/1990 | Kawano et al. | 455/22 |

OTHER PUBLICATIONS

Satellite Communication Systems Engineering Wilbur L. Pritchard Joseph A. Sciulli.
Hughes Aircraft Company Geosynchronous Spacecraft Case Histories vol. II Comunications Spacecraft Case Histories.
Coaxial Transmission Line Elements Cain Technology, Inc. For Use in RF Amplifier and Oscillator Tank Circuits Trans-Tech "The Ceramic Solution".

*Primary Examiner*—Reinhard J. Eisenzopf
*Assistant Examiner*—Gertrude Arthur
*Attorney, Agent, or Firm*—Terje Gudmestad; Elizabeth E. Leitereg; Wanda K. Denson-Low

[57] ABSTRACT

Input RF signals to a transponder, such as a communications satellite, are down converted to a lower intermediate frequency (IF) that is common for each different channel. The channel signals are all processed at the common IF, and then up converted to different respective transmission frequencies. This allows for a down conversion/signal processing/up conversion unit design that is the same for each channel (except for frequency and gain values), and facilitates the use of inexpensive available standard components as well as low bandwidth channel filters. An improved phase noise cancellation phase lock loop (PLL) is preferably used to generate tuning signals used in the up and down conversion processes. The PLL includes two loop mixers, with the down and up conversion mixing signals taken respectively from the inputs to the first and second loop mixers. The first and second loop mixers receive mixing signals at frequencies (T–R) and (T–IF–N·CLK) respectively, where T is the channel's transmission frequency, R is its reception frequency, N is the PLL's ÷N factor, and CLK is a clock frequency; the PLL's voltage controlled oscillator provides the down conversion tuning signal and the input to the first loop mixer at a frequency (R–IF), while a (T–IF) tuning signal for the up converter is taken from a filtered output of the first loop mixer.

16 Claims, 5 Drawing Sheets

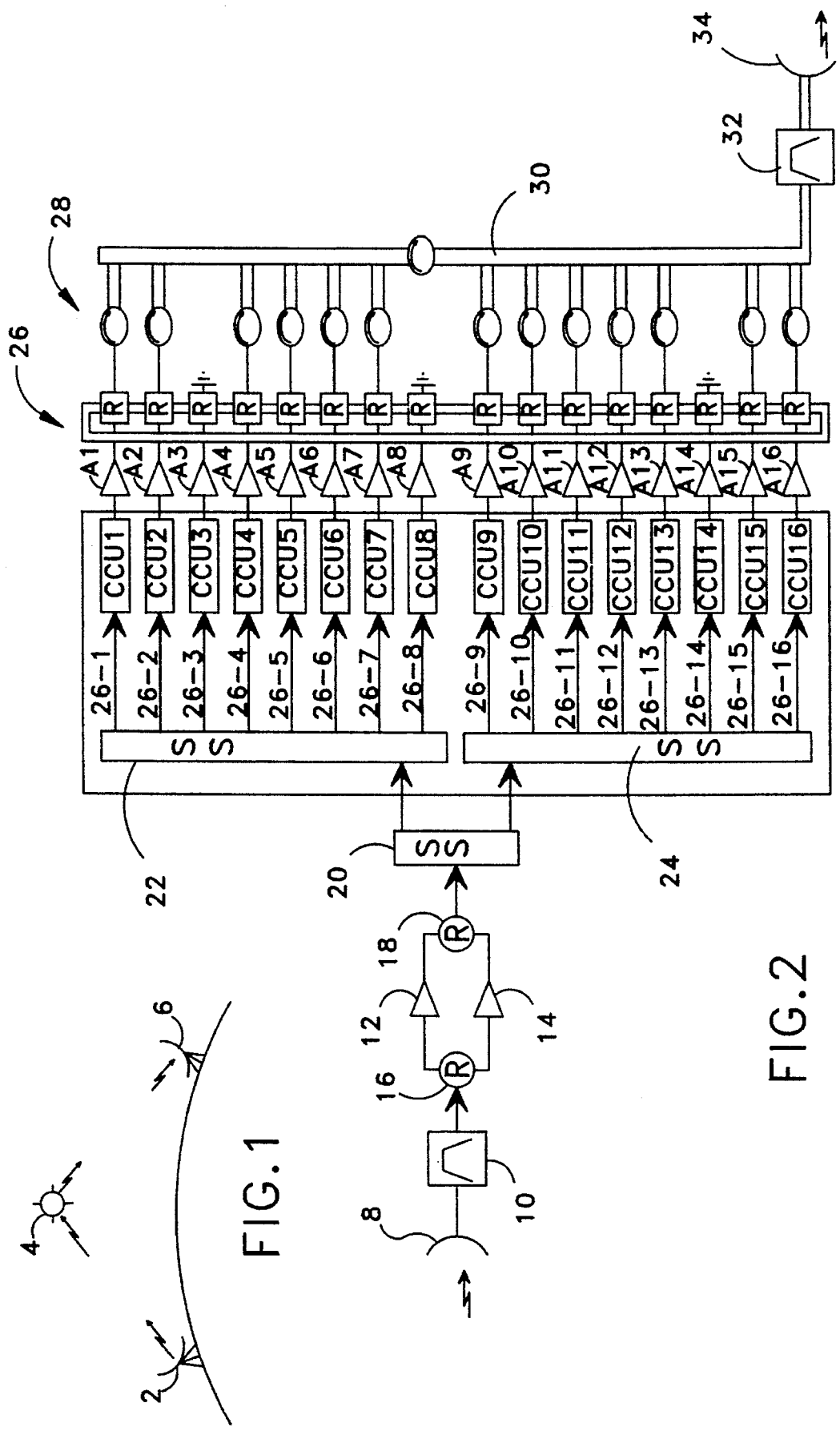

MULTI-CHANNEL TRANSPONDER WITH CHANNEL AMPLIFICATION AT A COMMON LOWER FREQUENCY

BACKGROUND OF THE INVENTION

1. Field of the Invention

This invention relates to transponder systems, and more particularly to communications transponders such as satellites which receive input signals at multiple channel frequencies, process the received signals and retransmit them at other frequencies.

2. Description of the Related Art

Satellite transponders typically receive ground-generated signals within one frequency band, such as the $K_u$ band (12.5–18 GHz), process the received signals, and then retransmit them back to earth within another frequency band such as the X-band (8–12.5 GHz). The transponder includes numerous channels that are allocated to communication traffic, with the channels separated from each other in frequency. For example, a commercial satellite will typically have 24 channels dedicated to different customers.

The signals received by the satellite are processed, typically by a gain control amplifier circuit, before being retransmitted. Each channel may have different processing requirements, since each customer may have unique applications. Thus, separate gain control amplifiers are provided for each channel.

The common approach currently used for satellite communications is to convert the frequency of each received signal down to its corresponding frequency for transmission back from the satellite, and to perform the gain control processing at the transmit frequency. Filtering is also performed at the transmit frequency to eliminate spurious signals. This type of system is described in Pritchard and Sciulli, *Satellite Communication Systems Engineering*, Prentice-Hall, Inc., 1986, pages 282–284. Performing channel filtering and gain control at the relatively high transmission frequencies requires expensive and complex microwave components to operate properly within a frequency range that may be as wide as 4–14 GHz, with a bandwidth of 500–000 MHz. Such wide bandwidths at the transmission frequencies make it very expensive and time consuming to tune acceptable signal responses over changing temperatures and frequencies. Furthermore, discrete or at least multichip components must be used to handle the relatively high frequencies, making it very difficult to implement any of the primary functions with a single chip integrated circuit.

The present approach also requires custom designed input multiplexers for each communications channel. In addition to adding to the cost and complexity of the transponder, the need for custom designed elements delays the design cycle. A satellite's frequency plan must be coordinated with all other possible sources of interference, both on the ground and in space. Because of the customized nature of present transponder architectures, satellite design and manufacturing cannot begin until permission from the Federal Communications Commission has been granted. Since the input multiplexers are custom designed, each satellite requires a mechanical design team to lay out the multiplexers and a receiver network to provide the proper interconnections and redundancy switching; this is a highly complex and expensive operation. Furthermore, switching is performed with heavy mechanical switches because of their physical location in the layout and their reliability.

It would also be highly desirable to have a "frequency nimble" transponder, meaning one that is capable of easily adjusting its channel frequencies. However, the customized aspect of present transponder designs, with all filters set to fixed frequencies, does not allow for changing frequencies. For example, if a channel user finds a different market application that requires a different frequency scheme after the transponder has been designed, the customer is locked into the original frequency scheme unless it invests the substantial amount of money and time necessary for a new transponder design. Once in-orbit, no changes to the frequency scheme can ever be made.

A known technique that does provide a degree of frequency nimbleness converts all of the received signals down to lower frequencies by a common down conversion factor, processes the channel signals at their separate lower frequencies, and then up converts the signals for transmission. Such an approach is described in Hughes Aircraft Company, *Geosynchronous Spacecraft Case Histories, Volume II*, 1981, pages iii and 2-7a.3 through 2-7a.7. However, it again requires a high degree of custom designed equipment that adds significantly to the system's cost and complexity.

SUMMARY OF THE INVENTION

The present invention seeks to provide a transponder system, particularly for use in satellites, that does not require custom designed components, is lighter and more compact than previous systems, eliminates the need for custom designed input multiplexers, can be implemented with integrated circuits, operates with a low noise level and is frequency nimble.

These advantages are achieved by down converting the input radio frequency (RF) signals for each channel to a lower common intermediate frequency (IF) that is the same for all channels, processing the channel signals at the common IF, and then up converting the signals to their respective transmit frequencies. Processing all of the channel signals at the same lower frequency eliminates the need for custom designed components, and allows a single common frequency to be selected for which processing components are readily and cheaply available.

In the preferred embodiment, separate down conversion/signal processing/up conversion units are provided for each channel, with each unit including a down conversion signal mixer that is tuned to the channel's individual receive frequency to produce a signal for processing at the common IF, and an up conversion signal mixer that is tuned to the channel's transmission frequency. The tuning signals are preferably generated by an improved phase noise cancellation phase lock loop (PLL) design that includes two loop mixers, with the down conversion mixing signal taken from the input to the first loop mixer and the up conversion mixing signal taken from the input to the second loop mixer. The first and second loop mixers receive mixing signals at frequencies (T–R) and (T–IF–N·CLK), respectively, where T is the channel's transmission frequency, R is the channel's receive frequency, N is the ÷N factor in the PLL, and CLK is the frequency of a clock signal applied to the PLL's frequency differential detector. The PLL has a high degree of frequency nimbleness; the receive and transmit frequencies for a particular channel can be easily adjusted by changing the ÷N factor for that channel by a ground-based control signal, while the differential between the transmission and reception frequencies (T–R) can be adjusted by generating this mixing signal with a separate PLL that is itself adjustable from the ground.

Further features and advantages of the invention will be apparent to those skilled in the art from the following detailed description, taken with the accompanying drawings.

BRIEF DESCRIPTION OF THE DRAWINGS

FIG. 1 is a conceptual diagram illustrating ground-based transmission to and from an orbiting satellite;

FIG. 2 is a schematic diagram of an overall transponder system in accordance with the invention.

DETAILED DESCRIPTION OF THE INVENTION

Figure 3:
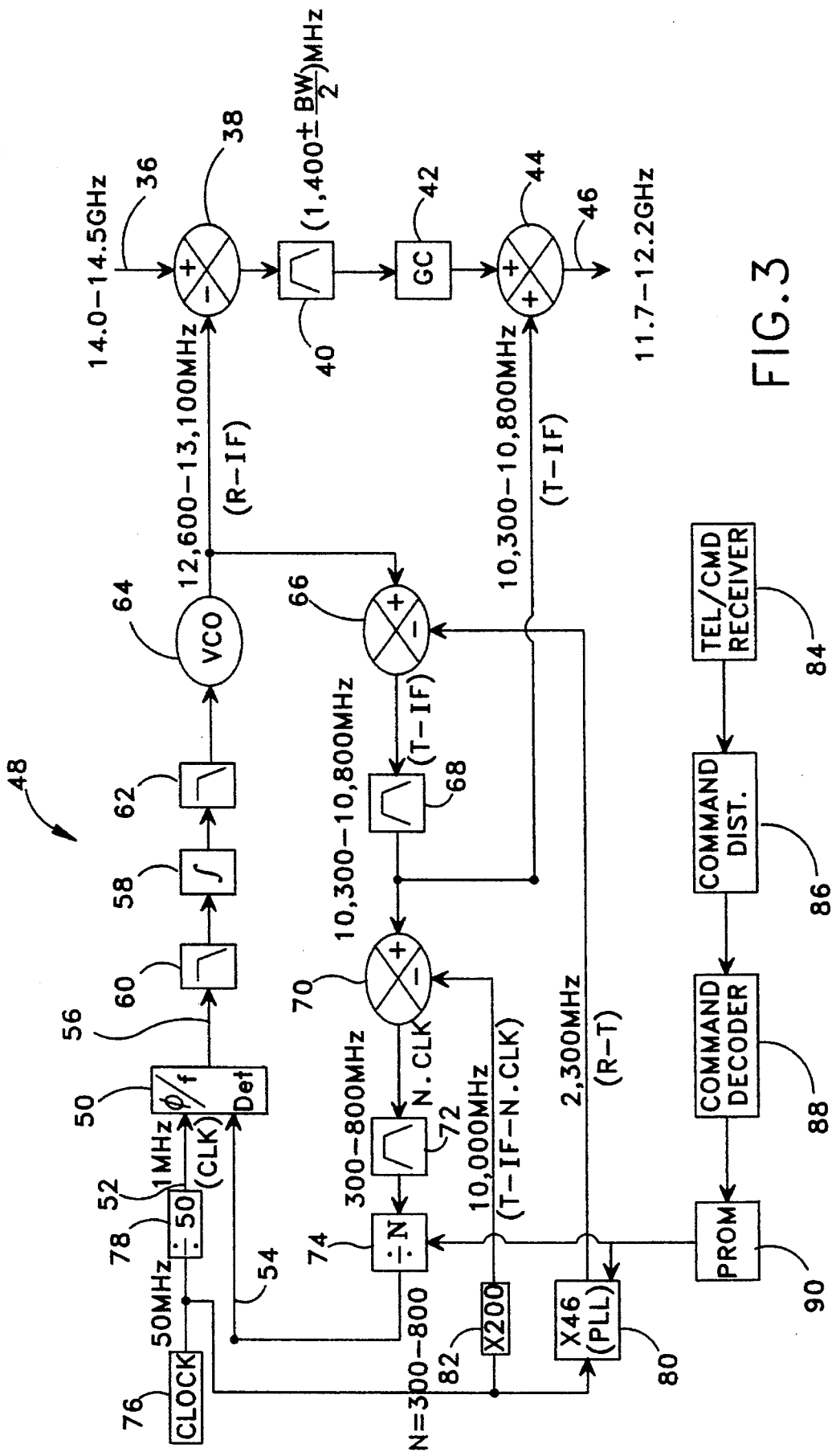
FIG. 3 is a schematic diagram of a standardized channel signal processing unit used in the transponder of FIG. 2.

The basic elements of a satellite communications system to which the invention is applicable are illustrated in FIG. 1. A ground-based transmitter 2 transmits an RF signal to an orbiting communications satellite 4, which processes and retransmits the signal to a ground receiver 6. The signal from transmitter 2 may include components at numerous different channel frequencies. The satellite can also handle multiple signals originating simultaneously from different transmission locations and redirected to different corresponding receivers.

The overall satellite signal processing system is shown in FIG. 2. Incoming signals are received by the satellite antenna 8 and forwarded to a band pass filter 10. The filter's pass band is typically a 500 MHz increment within the conventional 12.75–14.75 GHz satellite reception range.

The filtered input signal is amplified by one of two conventional low noise amplifiers 12 and 14, which are connected in parallel in a redundancy ring formed by redundancy switches 16 and 18. Only one of the amplifiers is normally active, with the other amplifier serving as a backup in case of failure.

The input signal is then divided into two equal strength signals by a hybrid signal splitter 20, with additional signal splitters 22 and 24 further splitting the divided signals into the desired channels, including redundant channels. The signal splitters can be implemented by power dividers or, in case multiple satellite antennas are employed or multiple beams are received from earth, the signal splitters could be implemented by switching networks to avoid having two different signals on the same channel at the same time. In either case, conventional signal splitters can be employed.

The signal splitters divide the incoming signal into the required number of channel inputs; in the illustration of FIG. 2 sixteen different inputs 26-1 through 26-16 are used. The signal on each channel is delivered to a respective channel control unit (CCU), identified as elements CCU1–CCU16. These units receive their respective channel's portion of the input signal, process it in a unique manner that allows for a significant reduction in cost, weight and complexity while providing a high degree of frequency nimbleness, and then convert it to a frequency for transmission by the satellite.

The outputs of the various channel conversion units are amplified by respective conventional high power amplifiers A1–A16 for retransmission. The amplified output signals are transmitted through a redundancy ring 28 that includes a network of redundancy switches R to replace failed channels with redundant channels, and then processed through respective isolators 28 that eliminate reflections. The isolators are connected to an output multiplexer line 30 that filters and combines the various channels for transmission back to earth by a satellite transmission antenna 34 (which may be combined with the reception antenna 8). Reject filters 32 can also be provided between the output multiplexer 20 and the transmit antenna 34.

All of the elements of FIG. 2 can be implemented in a conventional manner except for the CCUs. It is a distinct advantage of the invention that, even though the various CCUs process signals at different frequencies, a standardized CCU design is used that is substantially identical for each CCU except for the frequency values for each particular unit. This is accomplished by down converting all of the channel input signals to a lower IF which is the same for all of the different channels, performing the channel signal processing at the standardized IF, and then up converting the processed channel signals to their respective transmission frequencies. Since a frequency of 1.4 GHz is already used by many mobile cellular telephones and high quality channel controls have been developed at this frequency and are cheaply available, 1.4 GHz is a convenient IF to take advantage of the existing equipment in the cellular telephone sector.

FIG. 3 shows a preferred common design for each of the conversion units CCU1–CCU16. The channel input signal on input line 36 from the signal splitter can include components at any of the channel frequencies within the satellite's reception band, which for purposes of illustration is shown as 14.0–14.5 GHz. This input signal is applied as one mixing input to a signal mixer 38 that down converts the input signal to a lower IF that is common to all of the channels. As mentioned above, this IF is preferably 1,400 MHz. The down converted signal is processed through a band pass filter 40 that is centered on the IF and has a narrow pass band. Since all of the channels down convert their respective input signals to the same lower frequency IF, the bandwidth for channel filter 40 need be only as wide as the required channel bandwidth (typically 26–72 MHz). This narrow bandwidth facilitates the use of inexpensive components with highly repeatable signal performance.

The filtered IF signal is transmitted to a channel gain control element 42, which is typically formed from a network of amplifiers and variable attenuators. In general, each channel can have a different gain control requirement. The important criteria for the gain control circuit design of any particular channel include the desired channel gain (which includes the possibility of attenuation), high power efficiency, low noise, high linearity and small size and weight.

The gain control element 42 replaces the channel control units or driver limiter amplifiers used in conventional designs. Since gain control element 42 operates at an IF that is considerably lower than the high transmit frequency, an ASIC design can be used instead of the multichip or discrete designs utilized in the past. The pass band previously required was quite wide, on the order of 2 GHz, to allow a particular channel to be used as a redundancy element. The wide bandwidth and high frequency made the prior filters and gain control elements quite expensive, and also made it difficult to keep the signal performance stable over temperature. Reducing the IF to less than 2 GHz allows the gain control element 42 to be realized with silicon or gallium arsenide MMICs (monolithic microwave integrated circuits) that provide a higher circuit density and better performance and temperature stability than their prior higher frequency counterparts.

The output of the gain control element 42 is applied to a second mixer 44, which up converts the signal to an output on line 46 at the channel's transmission frequency, which is illustrated as being within the transmission band of 11.7–12.2 GHz.

The mixing signals used to perform both the down conversion and the up conversion are preferably obtained from a single phase lock loop (PLL) 48 of unique design. The mixing signals could also be generated with separate PLLs that are locked together, or in some applications the single-loop phase noise cancellation scheme described in U.S. Pat. No. 4,918,748 to McNab et al. (assigned to Hughes Aircraft Company, the assignee of the present invention) could be used. The latter approach substantially eliminates the phase noise that occurs with the use of multiple PLLs, but requires the use of a filter outside the loop which must pass the up conversion mixing signal band (such as 10,300–10,800 MHz) while rejecting a nearby large local oscillator signal (typically 10,000 MHz) that is used to generate the mixing signal. Such filters are difficult and expensive to obtain. The preferred single-PLL arrangement illustrated in FIG. 3 does not require a filter that rejects large nearby signals, and thus allows for a considerable reduction in both the filter complexity and cost.

The PLL 48 includes a conventional differential phase (frequency) detector 50 that receives a clock (CLK) input on line 52 and a loop return input on line 54, and produces an error signal on output line 56 that varies with any differential between the frequencies of its input signals. The error signal is processed through a loop filter 58, which is preferably preceded and followed by low pass filters 60 and 62, and controls the output of a voltage controlled oscillator (VCO) 64. The VCO is set to produce a nominal output frequency of (R–IF), where R is the channel frequency within the satellite's reception band. For example, if the channel frequency is 14,200 MHz and the IF is 1,400 MHz, the nominal VCO output would be 12,800 MHz. In FIG. 3 the VCO output is generalized as being within the range 12,600–13,100 or MHz, which covers all possible values of (R–IF) for a reception range of 14.0–14.5 GHz and an IF of 1,400 MHz. This output is applied as a tuning input to a negative input of the down conversion mixer 38 to convert the channel input signal down to the IF. An equivalent alternative would be for VCO 64 to produce an (R+IF) signal that is applied to a positive input of mixer 38, with the R signal on input line 36 applied to a negative mixer input to subtract from the (R+IF) signal from the VCO.

The VCO output is also applied to a loop mixer 66, which receives a second mixing signal at a frequency of (TR), where T is the channel's transmission frequency. The output of loop mixer 66 thus has a frequency of (T–IF), and is filtered by a pass band filter 68 whose pass band is equal to the difference between the satellite's transmission band and the IF. For example, with a transmission band of 11.7–12.2 GHz and the assumed IF of 1,400 MHz, filter 68 has a pass band of 10,300–10,800 MHz.

The output of filter 68 is delivered as a tuning input to the up conversion mixer 44, to up convert the IF output of gain control element 42 to the channel transmission frequency. It is also applied to a second loop mixer 70, which receives a second mixing signal at a frequency of (T–IF–N·CLK), where N is the loop divisor factor. The output of mixer 70 thus has a frequency of N·CLK, and is transmitted through a band pass filter 72 having a pass band that passes N·CLK for all permissible values of N. The output of filter 72 is applied to a ÷N loop divisor 74. The range of N is equal to the satellite's reception band divided by CLK, or 500 for the illustrated example. Thus, N in this case can vary from 300 to 800, with the minimum and maximum values of N corresponding to channel reception frequencies of 14.0 and 14.5 GHz, respectively.

If VCO 64 produces an (R+IF) rather than an (R–IF) output, the output of mixer 66 will be (T+IF) rather than (T–IF). In that case the IF output of the gain control element would be applied to a negative rather than a positive input of mixer 44 to produce the desired T mixer output, and a (T+IF–N·CLK) signal would be applied to the negative input to the second loop mixer 70. Other variations to the mixing signal frequencies and the polarities of the mixer inputs can be envisioned, all of which are equivalent to the particular frequency scheme shown in FIG. 3 if they produce an IF signal frequency input to the gain control element 42, and a T output frequency from mixer 44.

The various frequency signals are obtained from a regulated clock source 76, which is illustrated as outputting a 50 MHz signal. This is processed by a frequency divider 78 that divides by 50 to yield the 1 MHz CLK reference input on line 52 for the differential frequency detector 50. The 50 MHz clock signal is multiplied by a factor of 46 in a first frequency multiplier 80, and by a factor of 200 in a second frequency multiplier 82, to produce the (T–R) and (T–IF–N·CLK) mixing signals that are provided respectively to the first and second loop mixers 66 and 70.

The reception and transmission frequencies for each channel can be adjusted by a ground-based control signal that adjusts the ÷N factor for a particular channel. This commandability feature results in a frequency nimble pay load that allows the user to change the frequency plan at any time, including while the satellite is in-orbit. The PLL for a given channel can also be commanded to switch frequency schemes in case of a failure, eliminating the need for any input redundancy switches and cross connections.

To adjust a channel's ÷N factor, a serial digital command is transmitted from the controlling ground station to the satellite's telemetry and command receiver 84, which relays the command to the satellite's command distribution unit 86. This unit directs the command to the command decoder 88 for the designated channel, which decodes the command and accesses a programmable read only memory (PROM) 90 to set a new ÷N value. A telemetry and command receiver 84, command distribution unit 86, and channel command decoders 88 and PROMs 90 are conventionally provided in communications satellites.

Various modifications to the above described phase locked loop based synthesizer are possible. For example, the mixer 66 need not be within the loop. A fixed divider (prescaler) could be used in place of the mixer 70. A lower frequency could be used, followed by multipliers or mixers to obtain the high frequency L.O. signals.

If adjustability of the separation between the receive and transmit frequencies is desired in addition to an ability to adjust these frequencies jointly, the first frequency multiplier 80 can be implemented as a separate phase lock loop having its own adjustable ÷N divisor element. With this dual adjustability feature, the ÷N element 74 of the main PLL 48 would first be adjusted to achieve a desired reception frequency, followed by a command to adjust the ÷N factor of the secondary PLL 80 to achieve the desired transmission frequency.

Using currently available Si and GaAs ASIC and MMIC (monolithic microwave integrated circuit) technologies, many of the PLL components can be designed and manufactured on a single die. This greatly reduces the cost and improves the manufacturability of what has previously been expensive circuitry. Since the circuit designs for the PLLs of each channel are identical except for frequency, relatively large quantities of PLLs can be manufactured at one time, resulting in economies of scale that are not realizable in conventional receivers architectures which use only two to four receivers per spacecraft; the smaller quantities make it very expensive to design and manufacture PLLs for use in such units.

The channel filters 40 are preferably implemented with a novel cross-coupled ceramic filter that is small and light weight, typically less than 16 cc and 85 grams. Another advantage is an excellent frequency, phase and amplitude stability over temperature, eliminating the temperature stabilizing heaters or very careful placement of the filters within the payload that conventional cavity filters require to provide a stable base temperature. Cavity filters for high frequency are also very expensive, and have reliability problems stemming from debris that is impractical to eliminate because of the nature of the manufacturing process. Ceramic filters, by contrast, do not have cavities that can trap or hold debris. Although not as preferable as the cross-coupled ceramic filter, other filters such as that described in U.S. Pat. No. 4,431,977 could also be used.

A preferred implementation for the channel filters 40 is shown in FIGS. 4–8. The filter is constructed from dielectric (ceramic) coaxial resonators such as the resonator described in a catalog by TransTech Corp., *Coaxial Transmission Line Elements*, Rev. 2, 1992, pages 1–9. Such resonators have microwave resonant frequencies.

Figure 4:
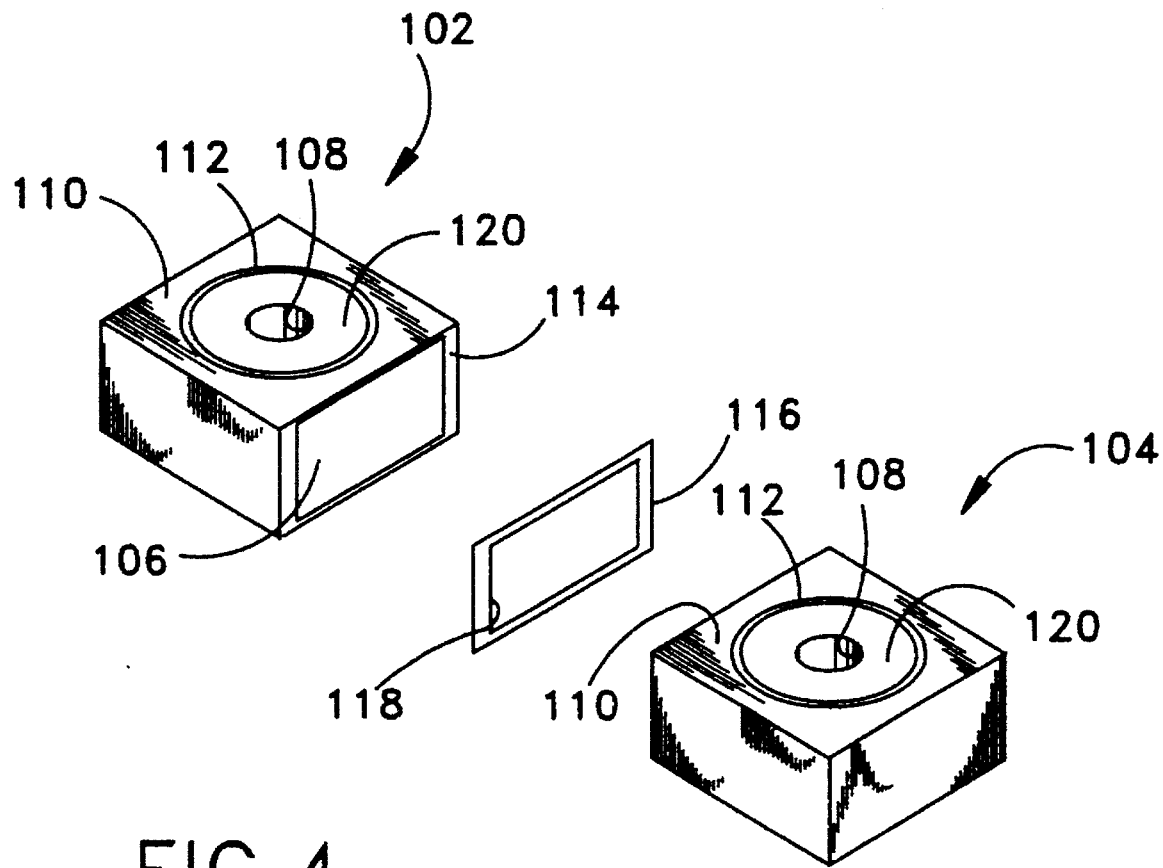
FIG. 4 is a perspective exploded view of inductively coupled resonator modules that are preferably used to implement the channel filters.
Figure 5:
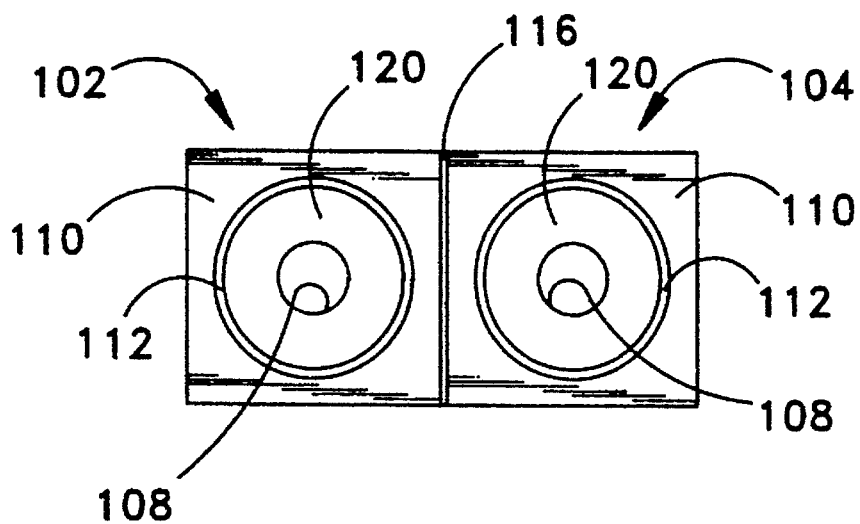
FIG. 5 is a plan view of an assembled inductively coupled resonator pair.

FIGS. 4 and 5 show a technique for adding shunt capacitances to a pair of dielectric resonators 102 and 104, and for inductively coupling the resonators together. The resonator is conventionally provided as a rectangular ceramic block 106 with holes 108 that extend from the top surface to the bottom surface. A conductive coating, preferably a plating 110, is deposited on the ceramic block 106 and through the hole of the block 108. Instead of the conductive plating conventionally supplied with a dielectric resonator, a preferred plating material for purposes of a microwave bandpass filter is a thick film silver-platinum ink; various combinations, including copper-silver or chrome-silver, may also be suitable.

A circular ring is formed in the conductive plating on the top surface surrounding the hole 108. The plated hole acts as a coaxial resonator, which is a short stub whose length is determined by the desired resonant frequency. At the microwave frequencies for which the invention is intended, the parameters associated with each resonator are the characteristic impedance and electrical length θ. To realize cross-couplings, the electrical length of each resonator is chosen to be approximately 60°. The characteristic impedance is predetermined by the dielectric constant of the material and the dimensions of the resonator itself.

Although circular gaps are used for shunt capacitance, a tuning screw can be inserted into the hole of the resonator for fine tuning adjustment of the resonant frequency.

The ceramic resonator 106 is exposed on one wall of the resonator by removing a section of the conductive plating 10 from the wall. In the preferred embodiment the conductive plating 10 frames the edges 114 of the coupling wall. To inductively couple the two resonators 102 and 104 together, the resonators are positioned such that their coupling walls are mated together, and a conductive shim 116 is placed between them. The shim, made of copper, can be interchanged to achieve specific inductive coupling. The shim is electrically and mechanically connected to the plating on the coupled wall 114 of each resonator.

An opening 118 in the interior portion of the shim controls inductive coupling between the two resonators when they are joined together with the shim in between. The thickness of the shim and the geometry of its opening determine the degree of coupling between the two resonators. This is a very convenient mechanism that does not require any portion of the resonators to be machined away, and allows the inductive coupling between resonators to be adjusted simply by using a different shim. As explained below, capacitive couplings between different resonators are formed by connecting capacitors to the portions 120 of the resonators' conductive plating that lie within their ring-shaped gaps 112.

Figure 6:
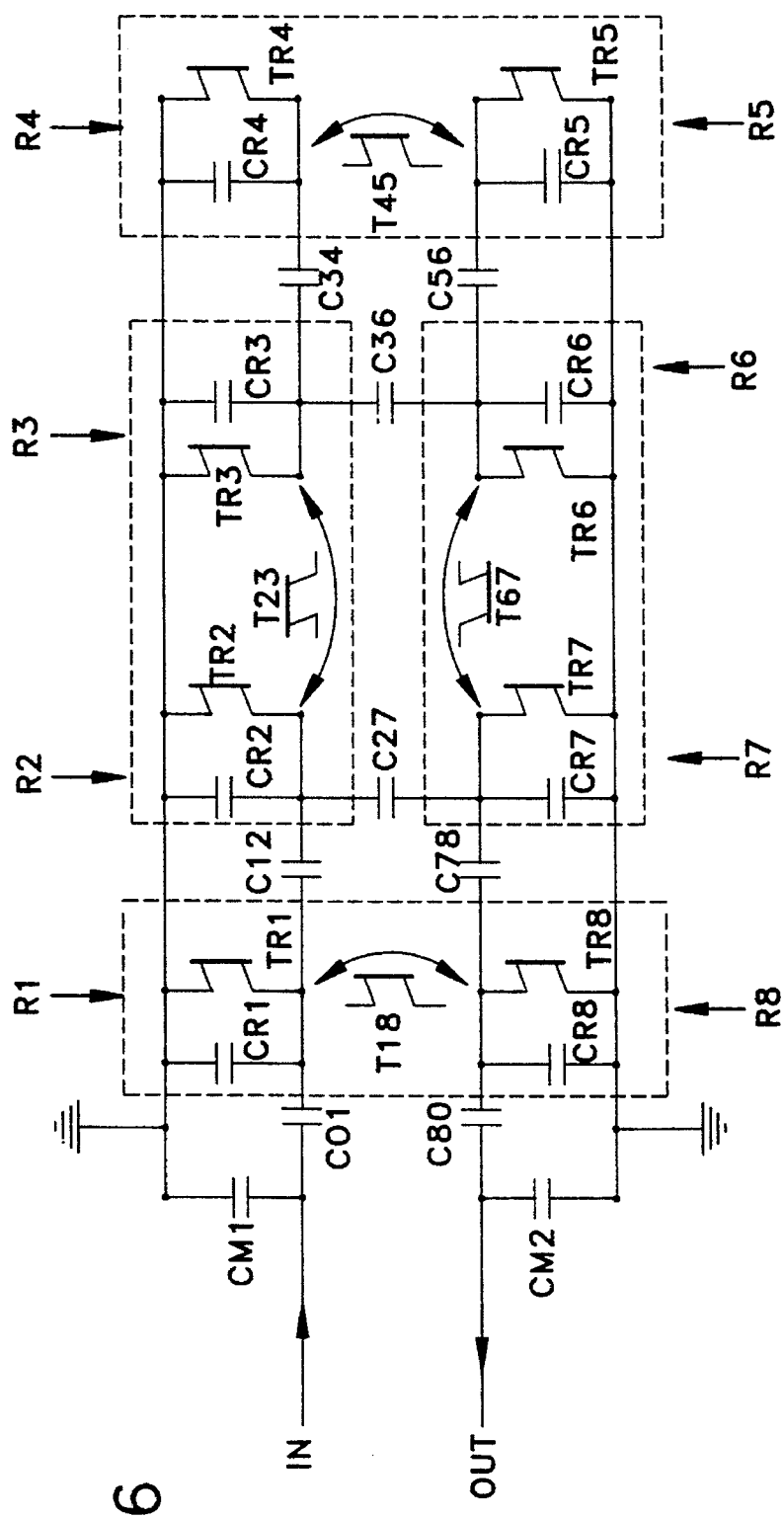
FIG. 6 is a circuit diagram of a cross-coupled filter that can be used for the channel filters.

FIG. 6 is a circuit diagram of a preferred filter configuration. It is a cross-coupled canonic design, as disclosed in Pfitzenmaier, "Synthesis and realization of narrow-band canonical microwave band pass filters exhibiting linear phase and transmission of zeros", IEEE Transactions on Microwave Theory and Techniques, Vol. MTT-30, pages 1300–1311, September 1982. The cross-coupled configuration shown in FIG. 6 has a number of advantages for applications such as a satellite transponder. It allows for the introduction of notches in the filter's response at both ends of its pass band which make its rejection steeper. It also enhances the equalization of the group delay within the pass band, helps to flatten the insertion loss and makes narrower bandwidths possible at high frequencies.

A filter is shown implemented with eight resonator cells R1–R8, which consist of respective parallel capacitors CR1–CR8 and inductive transmission lines TR1–TR8 shorted to ground. Resonator pairs R2 and R3, R4 and R5, and R6 and R7 are coupled inductively by T23, T45 and T67, respectively. Series capacitors C01, C12, C34, C56, C78 and C80 are inserted respectively between the input and R1, R1 and R2, R3 and R4, R5 and R6, R7 and R8, and R8 and the output. R2 and R7 are capacitively cross-coupled to each other by capacitor C27, and similarly R3 and R6 are cross-coupled together by capacitor C36. This configuration results in an eight-pole combine filter. CM1 and CM2 represent parasitic capacitances.

To produce a filter with a 1 GHz center frequency and a 36 MHz pass band, all of the resonator shunt transmission lines TR1–TR8 had 13 ohm characteristic impedances and 60° electrical lengths, and the values of the other circuit elements were:

| | |
|---|---|
| CM1, CM2 - 0.19 pF | C27 - 0.056 pF |
| CR1, CR8 - 5.21 pF | C36 - 0.0896 pF |
| CR2, CR7 - 6.675 pF | T23, T67 - 306 ohms |
| CR3, CR6 - 6.80 pF | T45 - 268 ohms |
| CR4, CR5 - 6.91 pF | T18 - 10135 ohms |
| CM1, CM1 - 0.19 pF | |
| C01, C80 - 1.51 pF | |
| C12, C78 - 0.26 pF | |
| C34, C56 - 0.274 pF | |

Figure 7:
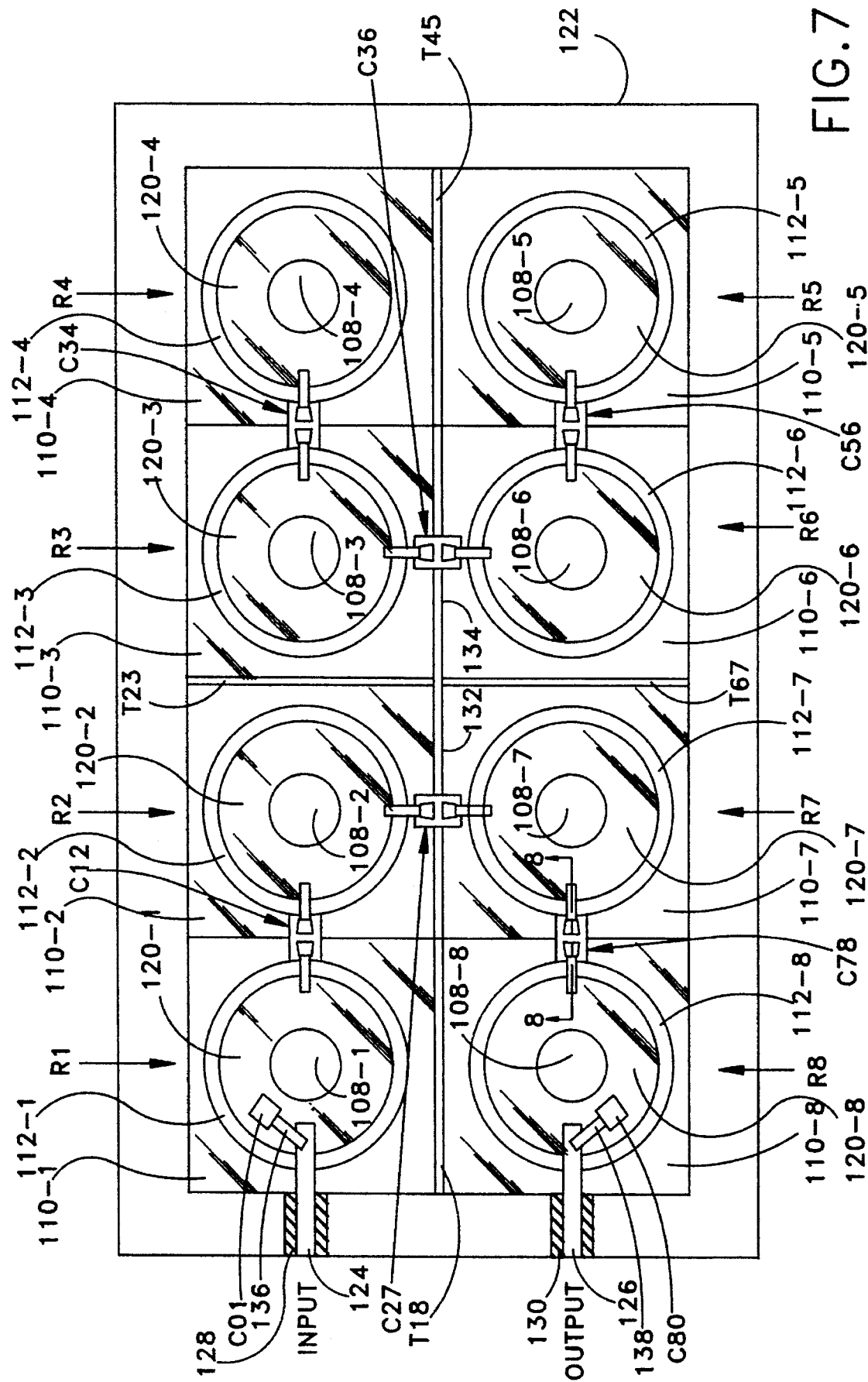
FIG. 7 is a plan view showing the physical structure used to implement the circuit of FIG. 6.

An implementation of this filter configuration with dielectric resonators is shown in FIG. 7. The physical elements which implement the various circuit functions indicated in FIG. 7 are identified by the same reference numbers as in FIG. 6. Eight dielectric resonators R1–R8 divided into two rows of four resonators each are used, although the filter could be extended to more or fewer resonators. The resonators are mounted on a common conductive collar 122 that serves as a ground plane.

Filter inputs and outputs are provided by pins 124 and 126, which are respectively secured in place by a teflon insulator within brass bushings 128 and 130 above the resonator surfaces. The shorted transmission lines TR1–TR8 and the shunt capacitors CR1–CR8 represent the shunt inductance and capacitance of each resonator. To obtain the shunt inductance and capacitance values mentioned above, Trans-Tech ceramic coaxial resonators SR8800 (High Profile) were used, with their metal plating replaced by a thick film silver-platinum ink. Each resonator as seen in FIG. 7 was 1.21×1.21 cm, while their heights were cut to 0.81 cm. The outer diameter of the ring-shaped gaps 12 was 0.965 cm for the gaps 112-1 and 112-8 of resonators R1 and R8, and 0.940 cm for gaps 112-2 through 112-7 of resonators R2–R7; the inner gap diameters were 0.81 for gaps 112-1 and 112-8, and 0.84 for gaps 112-2 through 112-7. The openings 108-1 through 108-8 of resonators R1–R8 Were 0.325 cm in diameter.

The inductive transmission line couplings T23, T45 and T67, and the cross-coupling transmission line T18, were implemented with respective shims 16. For inductive couplings T23 and T67 the shims had a width of 1.21 cm, a height of 0.89 cm, and an interior opening that was 0.648 $cm^2$ spaced 0.13 cm below the upper surface and 0.51 cm above lower surface. The width of the interior opening for the coupling T45 was extended to 0.693 cm. For the cross-coupling shim T18, a much smaller interior opening was provided to produce less coupling. In this case the shim was again 1.21 cm wide but 1.32 cm high, and the interior opening was circular with a 0.197 cm diameter centered 0.254 cm above the bottom edge. In all cases the shims were 0.0254 cm thick and made of copper. Solidfshims 132 and 134 without any interior openings were used to fill in the gaps between resonator pairs R3, R6 and R2, R7.

Conventional capacitors were used for capacitors C01 and C80, with one side soldered to the resonator surfaces 120-1 and 120-8 within the resonator's ring-shaped gaps, and the other side connected by ribbons 136 and 138 to the input and output pins 124 and 126, respectively. Each capacitor can be implemented in a conventional manner as a pair of parallel capacitors having opposite temperature coefficients (one positive and one negative) that provide a net temperature compensation.

Figure 8:
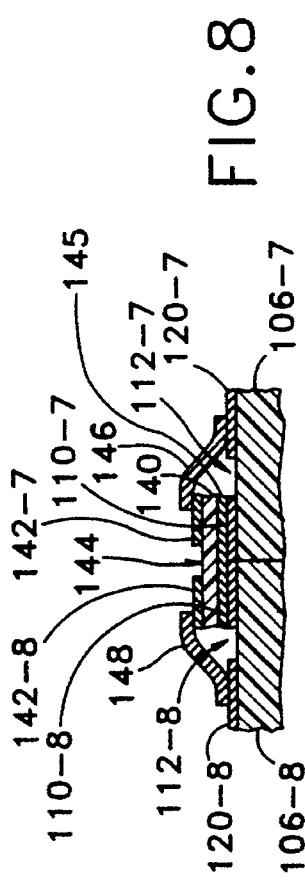
FIG. 8 is an enlarged fragmentary sectional view taken along the line 8–8 of FIG. 7.

The other series and cross-coupling capacitors C12, C34, C56, C78, C27 and C36 are preferably constructed as shown in FIG. 8, which is an enlargement of the series capacitor C78. The same reference numbers for the various dielectric resonator elements are used as in FIG. 4, followed by a hyphen and the resonator number. A preferably solid and continuous dielectric substrate 140 is attached to the resonator conductive plating 110-7 and 110-8, spanning the resonator interface. Capacitor pads 142-7 and 142-8 are etched on the upper dielectric surface, leaving a capacitive gap 144 between the pads. The pads are the same size, with a parallel gap in between. The pads are connected to the portions of the platings 120-7 and 120-8 inside the gaps 112-7 and 1-12-8 by respective connector ribbons 146 and 148, which may be gold or silver.

While an illustrative embodiment of the invention has been shown and described, numerous variations and alternate embodiments will occur to those skilled in the art. Such variations and alternate embodiments are contemplated, and can be made without departing from the spirit and scope of the invention as defined in the appended claims.

We claim:

1. A radio frequency (RF) signal transponder, comprising:
   a) a receive antenna for receiving input signals at different respective RF reception frequencies,
   b) an input band pass filter connected to restrict signals received from said antenna to a desired RF reception band,
   c) a signal splitter for splitting an input signal from said input band pass filter into a plurality of different input signals for different respective channels, each of said channels including:
      i) a down conversion signal mixer connected to receive the input signal for its channel,
      ii) a mixing signal generator for generating a down conversion mixing signal having an RF frequency equal to the difference between or sum of a desired reception frequency for that channel and a lower intermediate frequency (IF) that is common to each of said channels, and an up conversion mixing signal having an RF frequency equal to the difference between or sum of a desired transmission frequency for that channel and said IF, said mixing signal generator comprising:
         1) a signal generator for generating first and second loop mixing signals at respective frequencies equal to the difference between said reception and transmission frequencies, and to said transmission frequency offset by IF and further offset by N·CLK, where CLK is a clock signal frequency and N is a lop divisor factor,
         2) a differential frequency detector having CLK and variable frequency inputs,
         3) a loop filter connected to receive an output from said differential frequency detector,
         4) a voltage controlled oscillator (VCO) connected to receive an output control signal from said loop filter, and to produce said down conversion mixing signal as an output,
         5) a first loop mixer connected to mix said VCO output with said first loop mixing signal to produce said up conversion mixing signal as an output,
         6) a second loop mixer connected to mix said first loop mixer output signal with said second loop mixing signal to produce an output signal at a frequency less than either of said first loop mixer output or second loop mixing signals, and
         7) a ÷N frequency divider connected to divide the frequency of the second loop mixer output by N, and to apply the resulting frequency-divided signal to the differential frequency detector's variable frequency
      iii) a circuit for applying said down conversion mixing signal to said down conversion signal mixer to mix with said channel input signal and produce an output at said IF,
      iv) a channel band pass filter tuned to said IF and connected to filter the output of said down conversion signal mixer,
      v) a channel control connected to control the gain of the output of said down conversion signal mixer after it has been filtered by said channel band pass filter,
      vi) an up conversion signal mixer connected to receive a gain controlled output of said channel control, and
      vii) a circuit for applying said up conversion mixing signal to said up conversion signal mixer to mix with said channel control output and produce a channel output at said channel transmission frequency, d) a signal combiner for combining said channel outputs, and e) a transmit antenna for transmitting the combined channel outputs of said signal combiner.

2. The signal transponder of claim 1, wherein said ÷N frequency dividers are adjustable to adjust the reception and transmission frequencies for their respective channels.

3. The RF signal transponder of claim 1, wherein said desired reception and transmission frequencies differ from channel to channel.

4. The RF signal transponder of claim 1, wherein said channel controls have bandwidths substantially less than said IF.

5. The RF signal transponder of claim 1, wherein said IF is less than 2 GHz.

6. The RF signal transponder of claim 1 wherein each channel has a circuit design which, except for frequency and processing values, is substantially identical to the circuit designs of the other channels.

7. RF signal transponder of claim 1, wherein said channel controls include respective amplifiers for amplifying the channel input signals at a common IF, said amplifiers having bandwidths substantially less than said IF.

8. The satellite communications system of claim 7, wherein said IF is less than 2 GHz.

9. A phase noise cancelling phase lock loop (PLL) for producing a pair of output signals at respective frequencies (R offset by IF) and (T offset based upon a constant frequency input clock signal frequency CLK, where T is greater than R and R is greater than IF, comprising:

a signal generator for generating a pair of mixing signals at respective frequencies (R offset by T) and (T offset by IF offset by N·CLK) that do not dynamically vary, where N is a loop divisor factor, a differential frequency detector having a fixed frequency CLK input and a variable frequency input, a loop filter connected to receive an output from said differential frequency detector, a voltage controlled oscillator (VCO) connected to receive an output control signal from said loop filter, and to produce an output signal at said (R offset by IF) frequency, a first loop output terminal providing said (R offset by IF) output signal at said VCO output as a first loop output from the PLL, a first loop mixer connected to mix said VCO output with said (R offset by T) mixing signal to produce said (T offset by IF) signal as a first loop mixer output, a second loop output terminal providing said (T offset by IF) first loop mixer output as a second loop output from the PLL, a second loop mixer connected to mix said (T off-set by IF) first loop mixer output with said (T offset by IF offset by N·CLK) mixing signal to produce a second loop mixer output at a frequency less than the frequencies of the signals applied to said second loop mixer, and a ÷N frequency divider connected to divide the frequency of the second loop mixer output by N, and to apply the resulting frequency-divided signal to the differential frequency detector's variable frequency input.

10. The PLL of claim 9, further comprising a band pass filter between said first and second loop mixers that is tuned to (T offset by IF).

11. The PLL of claim 9, wherein said ÷N frequency divider is adjustable to adjust said PLL output frequencies.

12. The PLL of claim 11, wherein said signal generator is adjustable to adjust the frequency of said (R offset by T) mixing signal and thereby adjust the ratio between R and T.

13. A radio frequency (RF) signal transponder, comprising:

i) a down conversion signal mixer connected to receive said input signal, ii) a mixing signal generator for generating a down conversion mixing signal having an RF frequency equal to the difference between or sum of a desired reception frequency for said channel and a lower intermediate frequency (IF), and an up conversion mixing signal having an RF frequency equal to the difference between or sum of a desired transmission frequency for said channel and said IF, said mixing signal generator comprising:

1) a signal generator for generating first and second loop mixing signals at respective frequencies equal to the difference between said reception and transmission frequencies, and to said transmission frequency offset by IF and further offset by N·CLK, where CLK is a clock signal frequency and N is a loop divisor factor, 2) a differential frequency detector having CLK and variable frequency inputs, 3) a voltage controlled oscillator (VCO) connected to receive an output control signal from said differential frequency detector, and to produce said down conversion mixing signal as an output, 4) a first loop mixer connected to mix said VCO output with said first loop mixing signal to produce an output signal with a frequency equal to said transmission frequency offset by IF, 5) a second loop mixer connected to mix said first mixer output signal with said second loop mixing signal to produce an output signal, and 6) a ÷N frequency divider connected to divide the frequency of the second loop mixer output by N, and to apply the resulting frequency-divided signal to the differential frequency detector's variable frequency input, iii) a circuit for applying said down conversion mixing signal to said down conversion signal mixer to mix with said input signal and produce an output at said IF, iv) a channel band pass filter tuned to said IF and connected to filter the output of said down conversion signal mixer, v) a channel control connected to control the gain of the output of said down conversion signal mixer after it has been filtered by said channel band pass filter, vi) an up conversion signal mixer connected to receive a gain controlled output of said channel control, and vii) a circuit for applying said up conversion mixing signal to said up conversion signal mixer to mix with said channel control output and produce a channel output at said transmission frequency.

14. The signal transponder of claim 13, wherein said signal generator is adjustable to adjust the difference between said desired reception and transmission frequencies.

15. The signal transponder of claim 13, wherein said channel control includes an amplifier for amplifying the input signal at said IF, said amplifier having a bandwidth substantially less than said IF.

16. The signal transponder of claim 13, wherein said IF is less than 2 GHz.

* * * * *